US012768901B2

(12) United States Patent
Fan et al.

(10) Patent No.: US 12,768,901 B2
(45) Date of Patent: Oct. 20, 2026

(54) ELECTRONIC LOAD TESTING SYSTEM

(71) Applicant: Shenzhen Zhiyong Electronics Co., Ltd., Shenzhen (CN)

(72) Inventors: Xiaoming Fan, Shenzhen (CN); Jiawei Fan, Shenzhen (CN)

(73) Assignee: Shenzhen Zhiyong Electronics Co., Ltd., Shenzhen (CN)

(*) Notice: Subject to any disclaimer, the term of this patent is extended or adjusted under 35 U.S.C. 154(b) by 111 days.

(21) Appl. No.: 19/063,045

(22) Filed: Feb. 25, 2025

(65) Prior Publication Data

US 2026/0186072 A1 Jul. 2, 2026

(30) Foreign Application Priority Data

Dec. 31, 2024 (CN) ......................... 202411993330.5

(51) Int. Cl.
*G01R 31/40* (2020.01)
*H03F 3/45* (2006.01)

(52) U.S. Cl.
CPC .......... *G01R 31/40* (2013.01); *H03F 3/45475* (2013.01)

(58) Field of Classification Search
CPC ........ G01R 31/40; G01R 1/28; H03F 3/45475
See application file for complete search history.

(56) References Cited

FOREIGN PATENT DOCUMENTS

| | | | | | |
|---|---|---|---|---|---|
| CN | 103259345 | A | * | 8/2013 | |
| CN | 117572260 | A | * | 2/2024 | ......... G01R 31/3842 |

* cited by examiner

*Primary Examiner* — Alesa Allgood
(74) *Attorney, Agent, or Firm* — JEEN IP LAW, LLC

(57) ABSTRACT

The present invention provides an electronic load testing system, including a testing cable, a first electronic load, a second electronic load, and a control module. The control module is respectively connected to the first electronic load and the second electronic load and inputs a first input signal and a second input signal set in a correlate manner, so that a change of a total load current of a switching power supply is kept consistent with a change of the first input signal. The electronic load testing system provided by the present invention can eliminate the influence of distributed inductance in the testing cable on detection and satisfy the performance testing requirement of the switching power supply on dynamic high-speed response.

9 Claims, 10 Drawing Sheets

ELECTRONIC LOAD TESTING SYSTEM

CROSS-REFERENCE TO RELATED APPLICATIONS

This application claims priority to Chinese Patent Application No. 202411993330.5, filed on Dec. 31, 2024, which is hereby incorporated by reference in its entirety.

TECHNICAL FIELD

The present invention relate to the technical field of electronic loads, in particular to an electronic load testing system.

BACKGROUND

A switching power supply is mainly used to provide a constant direct current voltage (for example, 5V) in the electronic and electrical field. In daily life, an adapter for common charging household appliances such as a mobile phone, a tablet personal computer, and a notebook computer is a switching power supply. Correspondingly, the household appliances such as the mobile phone, the tablet personal computer, and the notebook computer are loads that consume electric energy. For the switching power supply, voltage stability is a quite important performance index. In research, development and manufacturing processes, it is necessary to detect the static stability and dynamic response of the switching power supply. The dynamic response must be detected in a case where a current consumed by a load changes rapidly, so that whether the voltage outputted by the switching power supply is stable is observed.

In the research, development, and manufacturing processes, the switching power supply will not be directly connected to the household devices such as the mobile phone, the tablet personal computer, and the notebook computer. Therefore, in the prior art, the dynamic performance of the switching power supply is detected by simulating a way of providing the electronic load by an electronic device.

However, the electronic load in the prior art is to simulate a condition that the current can change at 100 A current per microsecond. The detected high-power switching power supply and high-power electronic load are large in bulk size and weight. For example, for a 10 KW electronic load, it is necessary to arrange large radiators and fans which are usually set to be over 30 kg. To facilitate testing, it is necessary to provide a cable 1-2 m long between the switching power supply and the electronic load for connection.

Referring to FIG. 1 and FIG. 2, FIG. 1 is a structure diagram of an electronic load testing system in the prior art, and FIG. 2 is an oscillogram of an input signal and an output signal of the electronic load shown in FIG. 1. The electronic load testing system in the prior art includes a switching power supply 30, an electronic load 3, and a testing cable 1 configured to connect the electronic load 3 and the switching power supply 30. Since the high-speed change of the current is simulated in the testing process, the testing cable 1 will form certain parasitic inductance L, also referred to as distributed inductance which hinders the electronic load from changing the current rapidly, so that the detection result is affected. Whether the switching power supply 30 can satisfy the performance requirement of high-speed response cannot be determined. It may also be seen from FIG. 2 that a control signal $I_a$ inputted by the electronic load and a current signal $I_1$ outputted thereby change inconsistently, and the rate of change of the outputted current signal $I_1$ is significantly affected by the testing cable and is less than that of the inputted control signal $I_a$.

Therefore, the electronic load testing system in the prior art has severe deficiencies and cannot satisfy the requirement for detection of high dynamic performance of the switching power supply, and the detection error is large.

SUMMARY

The present invention provides an electronic load testing system to solve a detection error of dynamic response of the above switching power supply.

The present invention provides an electronic load testing system, including a testing cable, a first electronic load, a second electronic load, and a control module, where a proximal end of the testing cable is connected to the switching power supply; the first electronic load is provided at a distal end of the testing cable and the testing cable is provided between the first electronic load and the switching power supply; the second electronic load is provided at the proximal end of the testing cable, is close to the switching power supply or is directly provided at an output terminal of the switching power supply; and the control module is respectively connected to the first electronic load and the second electronic load and inputs a first input signal and a second input signal set in a correlated manner, and the first electronic load and the second electronic load respectively output a first current and a second current to the switching power supply, so that a change of a total load current is kept consistent with a change of the first input signal; and where a rate of change of the second current is higher than a rate of change of the first current.

Compared with the prior art, the electronic load testing system provided by the present invention is provided with the first electronic load, the second electronic load, and the control module, and controls the first electronic load to generate a main current required to test the switching power supply through the control module and controls the second electronic load to generate a slave current required to test the switching power supply, so that the change of the total load current of the switching power supply is kept consistent with the change of the first input signal provided by the control module, and therefore, the influence of the distributed inductance in the testing cable on detection is eliminated, and the performance testing requirement of the switching power supply on dynamic high-speed response is satisfied.

Besides, the second electronic load only processes a high-speed dynamic pulse current that cannot be processed by the first electronic load, i.e., the rate of change of the second current is higher than the rate of change of the first current. This setting mode may enable relatively low power consumption of the second electronic load and small size and weight as well, so that the second electronic load is provided at the proximal end of the testing cable, is close to the switching power supply or is directly provided at the output terminal of the switching power supply. Installation is easier in the testing process, and the testing result will not be affected by the distributed inductance in the testing cable.

BRIEF DESCRIPTION OF DRAWINGS

In order to describe the technical solutions in the embodiments of the present invention more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative labor.

DESCRIPTION OF EMBODIMENTS

Figure 1:
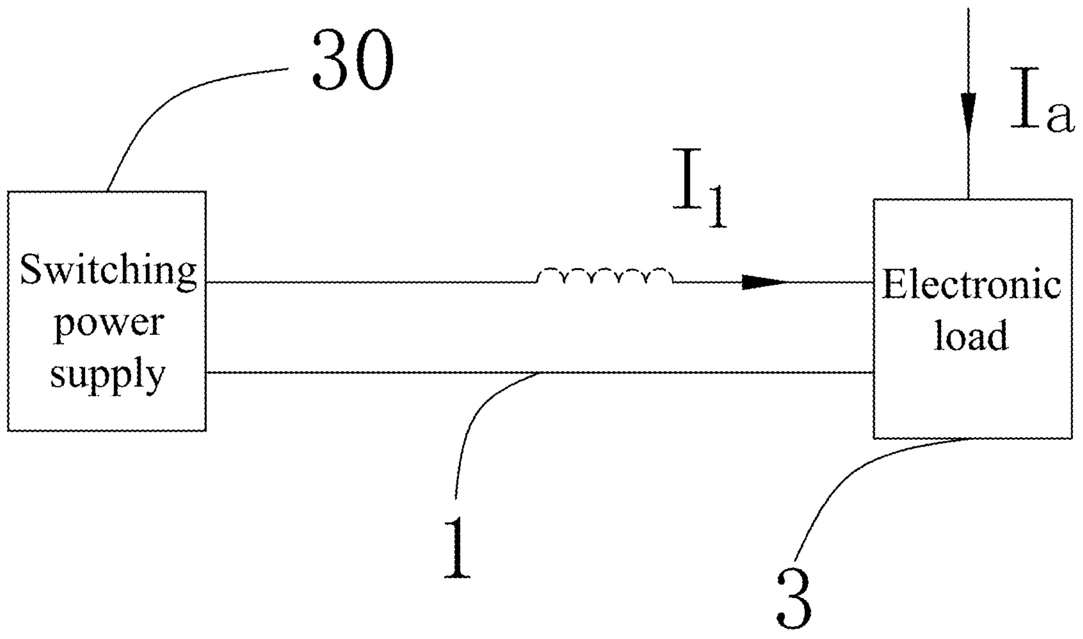
FIG. 1 is a structure diagram of an electronic load testing system in the prior art.

The following clearly and completely describes the technical solutions in the embodiments of the present invention with reference to the accompanying drawings in the embodiments of the present disclosure. Apparently, the described embodiments are some of the embodiments of the present invention rather than all embodiments. On the basis of the embodiments in the present disclosure, all other embodiments acquired by those of ordinary skill in the art without creative labor fall within the protection scope of the present disclosure.

It shall be noted that all directional indications (for example, upper, lower, left, right, front, back and the like) in the embodiment of the present invention are merely used for explaining relative position relations, moving conditions and the like between components in a certain special gesture (as shown in the drawings). If the special gesture changes, the directional indications will change correspondingly.

In addition, descriptions such as "first" and "second" are merely used for a description purpose rather than being construed as indicating or implying relative importance or implicitly indicating the quantity of indicated technical features. Thus, features defining "first" and "second" may expressively or implicitly include at least one feature. In the description of the present disclosure, unless otherwise specified, "a plurality of" means at least two, for example, two, three and the like.

In the present disclosure, unless otherwise expressly stated and defined, the terms "connect", "fix" and the like shall be understood in a board sense, for example, "fix" may be fixed connection or detachable connection or integral connection; it may be mechanical connection or electrical connection; it may be direct connection or connection via an intermediate, or it may communication of two components insides or an interactive relation of the two components, unless otherwise specified. Those of ordinary skill in the art may understand the specific meaning of the terms in the present invention under specific circumstances.

In addition, the technical solutions of the embodiments of the present invention may be combined one another based on implementation by those of ordinary skill in the art. When the technical solutions contradict each other in combination or may not be realized, it is to be considered that there is no combination of the technical solutions, which shall not fall into the protection scope of the present invention.

Figure 3:
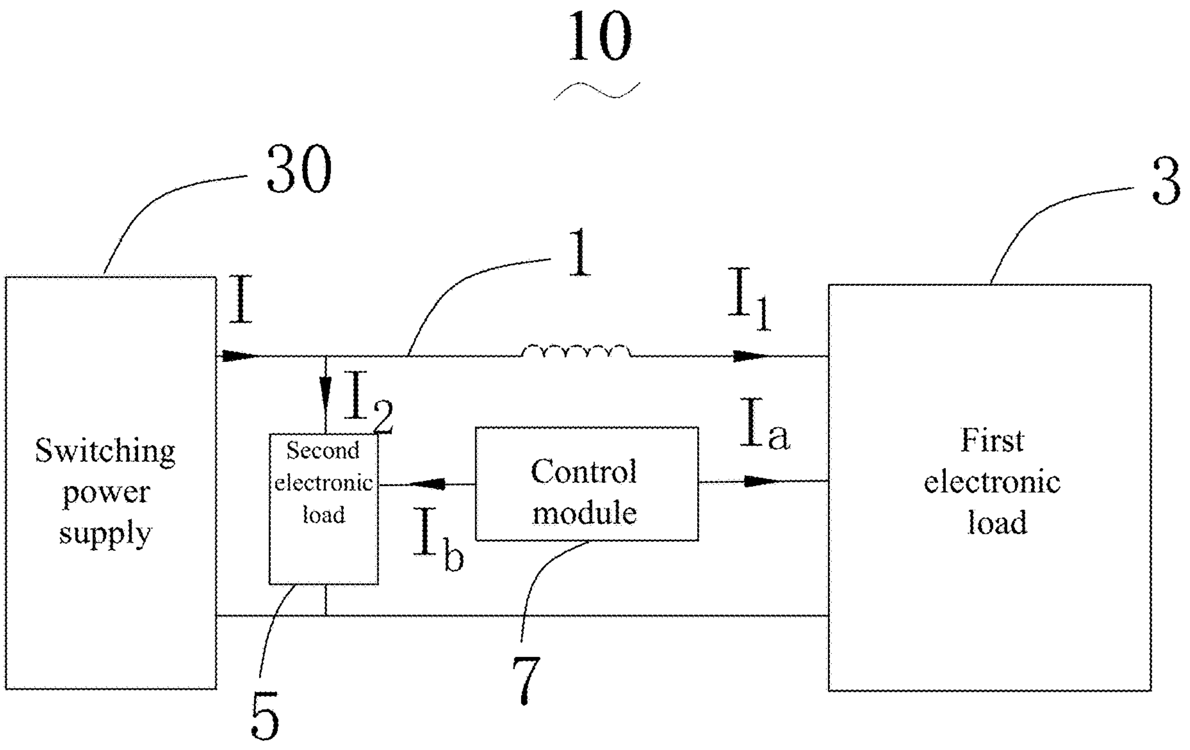
FIG. 3 is a structure diagram of the electronic load testing system provided by the present disclosure.
Figure 4:
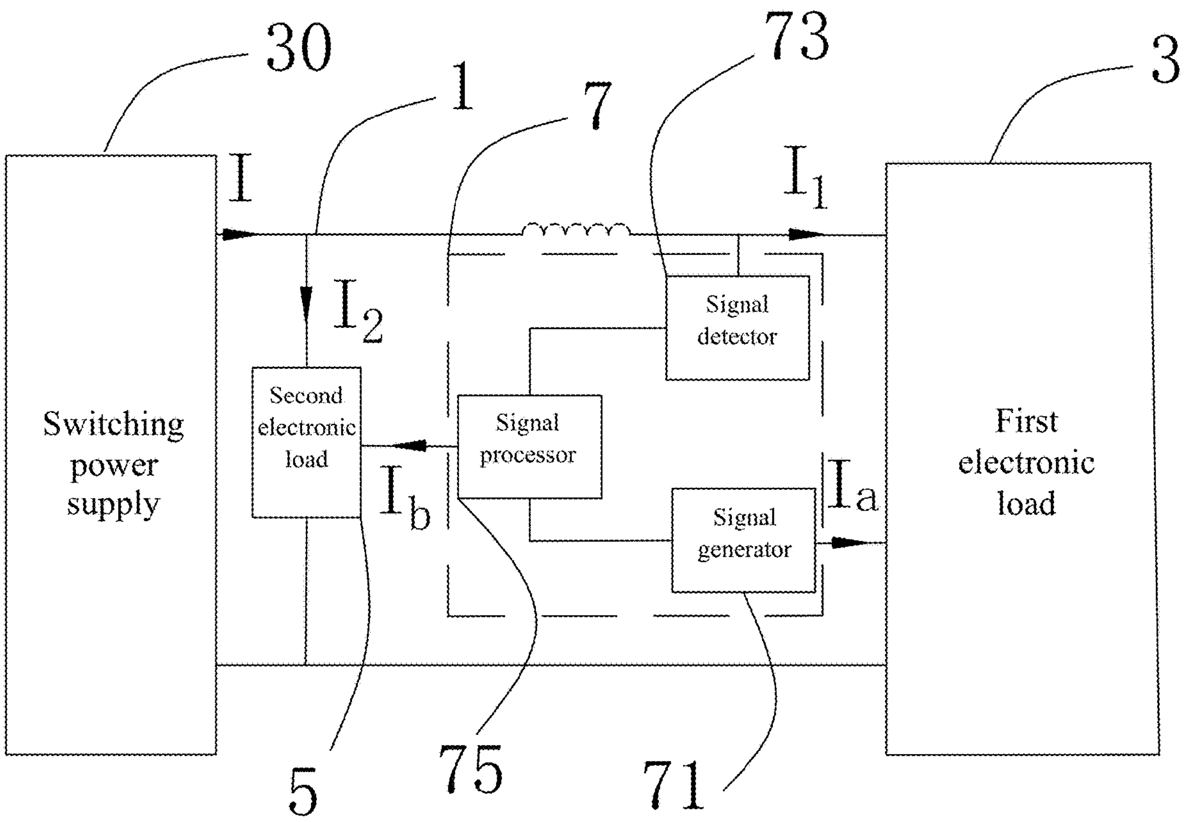
FIG. 4 is a topological graph of a first embodiment of the electronic load testing system provided by the present disclosure.

Referring to both FIG. 3 and FIG. 4, an electronic load testing system 10 includes a testing cable 1, a first electronic load 3, a second electronic load 5, and a control module 7. A proximal end of the testing cable 1 is connected to a switching power supply 30, the first electronic load 3 is provided at a distal end of the testing cable 1, and the testing cable 1 is provided between the first electronic load 3 and the switching power supply 30. The second electronic load 5 is provided at the proximal end of the testing cable 1, is close to the switching power supply 30 or is directly provided at an output terminal of the switching power supply 30. The control module 7 is respectively connected to the first electronic load 3 and the second electronic load 5 to input a first input signal $I_a$ and a second input signal $I_b$ set in a correlated manner, and the first electronic load 3 and the second electronic load 5 respectively output a first current $I_1$ and a second current $I_2$ to the switching power supply 30, so that a change of a total load current I of the switching power supply 30 is kept consistent with a change of the first input signal $I_a$. A rate of change of the second current $I_2$ is higher than a rate of change of the first current $I_1$.

It shall be noted herein that the proximal end and the distal end of the testing cable 1 are relative to the switching power supply 30. The end close to the switching power supply 30 is the proximal end and the end away from the switching power supply 30 is the distal end. To test the high-power switching power supply 30, the power of the first electronic load 3 is also high and the size and weight are large as well. Therefore, the testing cable 1 1-2 m long must be provided for connection. Therefore, the first electronic load 3 is provided at the distal end of the testing cable 1 and the second electronic load 5 is configured to provide the second current $I_2$ to process a high-speed dynamic pulse current that cannot be processed by the first electronic load 3 as the first electronic load is affected by the distributed inductance of the testing cable 1. Thus, the consumed dynamic power is relatively low and the size and weight are smaller. That is, the rate of change of the second current $I_2$ is higher than the rate of change of the first current $I_1$. Therefore, the second electronic load 5 may be directly provided at the proximal end of the testing cable 1.

The electronic load testing system 10 controls the first electronic load 3 to generate a main current required to test the switching power supply 30 through the control module 7, i.e., the first current $I_1$, and controls the second electronic load 5 to generate a slave current required to test the switching power supply 30, i.e. the second current $I_2$, so that the change of the total load current I of the switching power supply 30 is kept consistent with the change of the first input signal $I_a$ provided by the control module 7, and therefore, the influence of the distributed inductance in the testing cable 1 on detection is eliminated, and the performance testing requirement of the switching power supply 30 on dynamic high-speed response is satisfied.

Moreover, in the electronic load testing system 10, the second electronic load 5 may be provided at the proximal end of the testing cable 1, is close to the switching power supply 30 or is directly provided at the output terminal of the switching power supply 30, so that installation is easier in the testing process. Moreover, the second electronic load 5 will not be affected by the distributed inductance in the testing cable 1 as the second electronic load is provided at the proximal end of the testing cable 1, so that the second electronic load may be controlled precisely, and the testing result of the switching power supply 30 will not be affected by the distributed inductance in the testing cable 1.

In addition, the correlation between the first input signal $I_a$ and the second input signal $I_b$ refers to a correlation between the two signals. A concrete embodiment is that adjusted by the control module 7, upon respectively receiving the first input signal $I_a$ and the second input signal $I_b$ by the first electronic load 3 and the second electronic load 5, the sum of the outputted first current $I_1$ and second current $I_2$ is kept consistent with the change of the first input signal $I_a$, that is, the change of the total load current I is kept consistent with the first input signal $I_a$. Parameters such as magnitudes and rates of change of the first input signal $I_a$ and the second input signal $I_b$ are not limited herein, only indicating that there is certain correlation between the two signals. By inputting the second input signal $I_b$, the high dynamic performance test on the switching power supply 30 may be realized.

Figure 2:
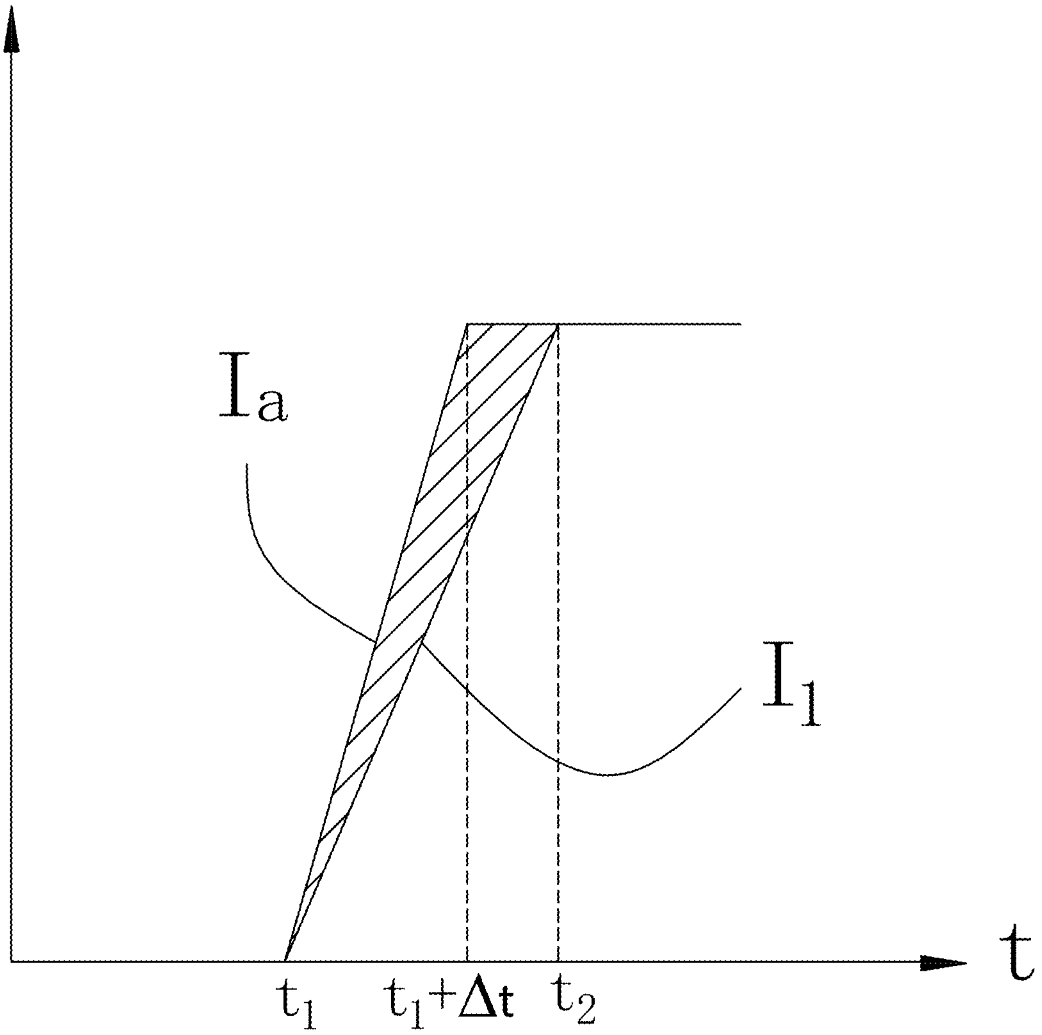
FIG. 2 is an oscillogram of an input signal $I_a$ and an output signal $I_1$ of the electronic load shown in FIG. 1.
Figure 5:
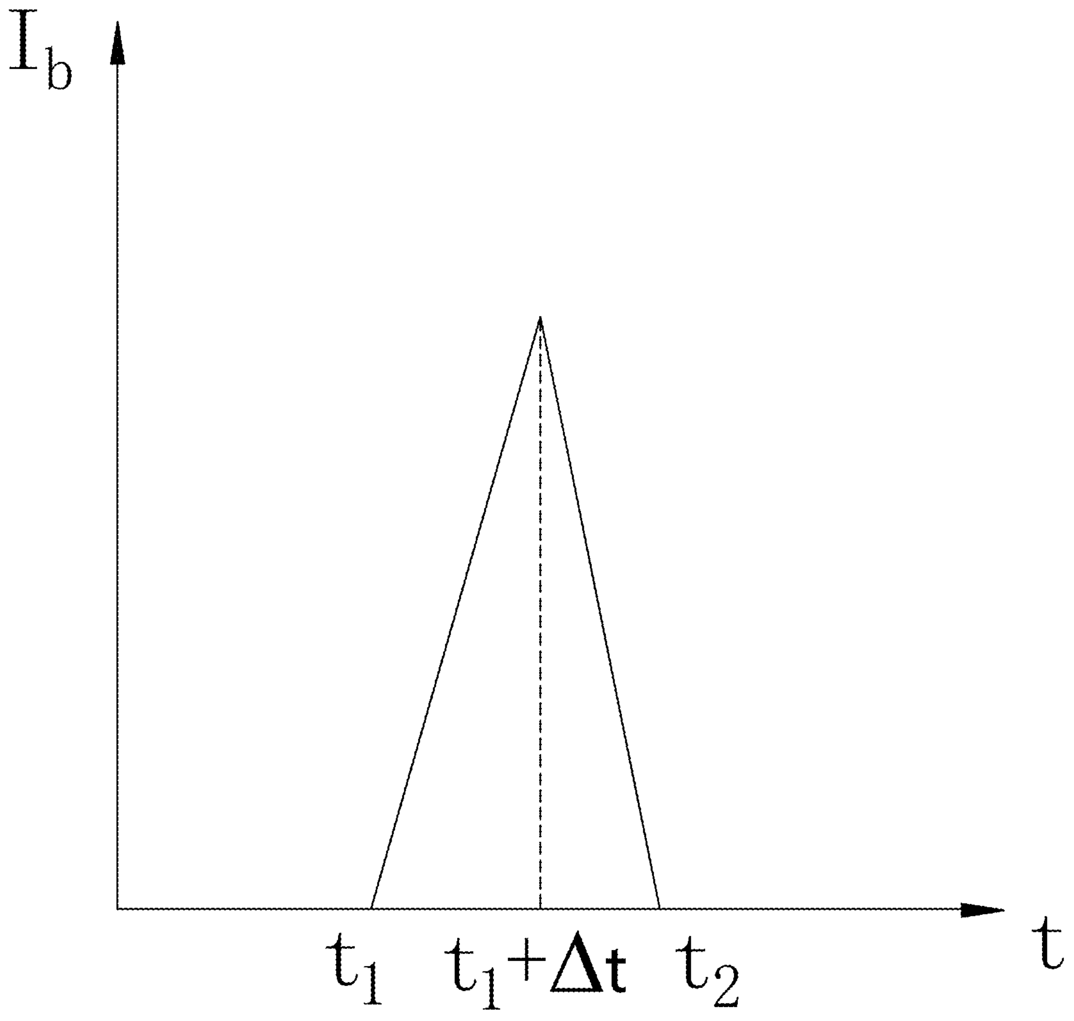
FIG. 5 is an oscillogram of a second input signal $I_b$ shown in FIG. 4.
Figure 6:
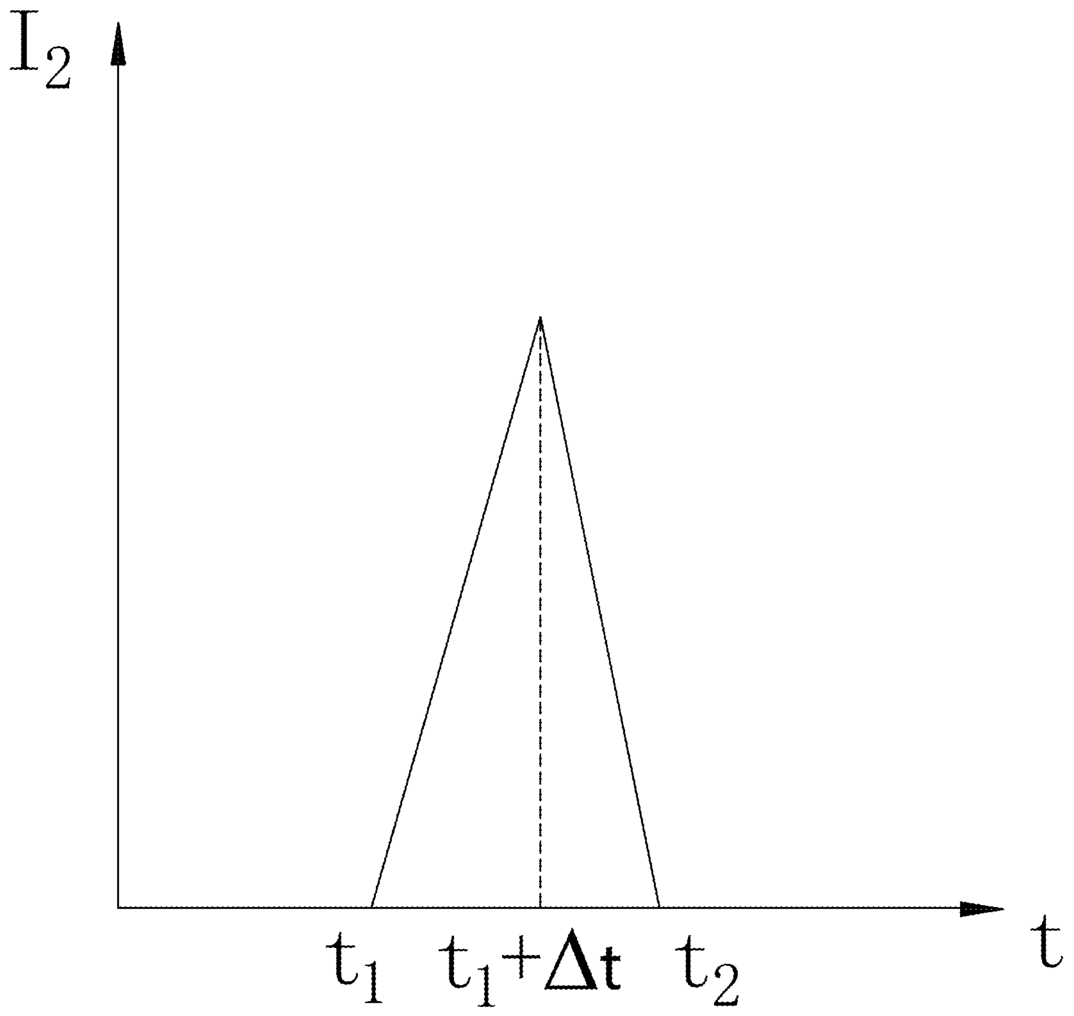
FIG. 6 is an oscillogram of a second current $I_2$ shown in FIG. 4.
Figure 7:
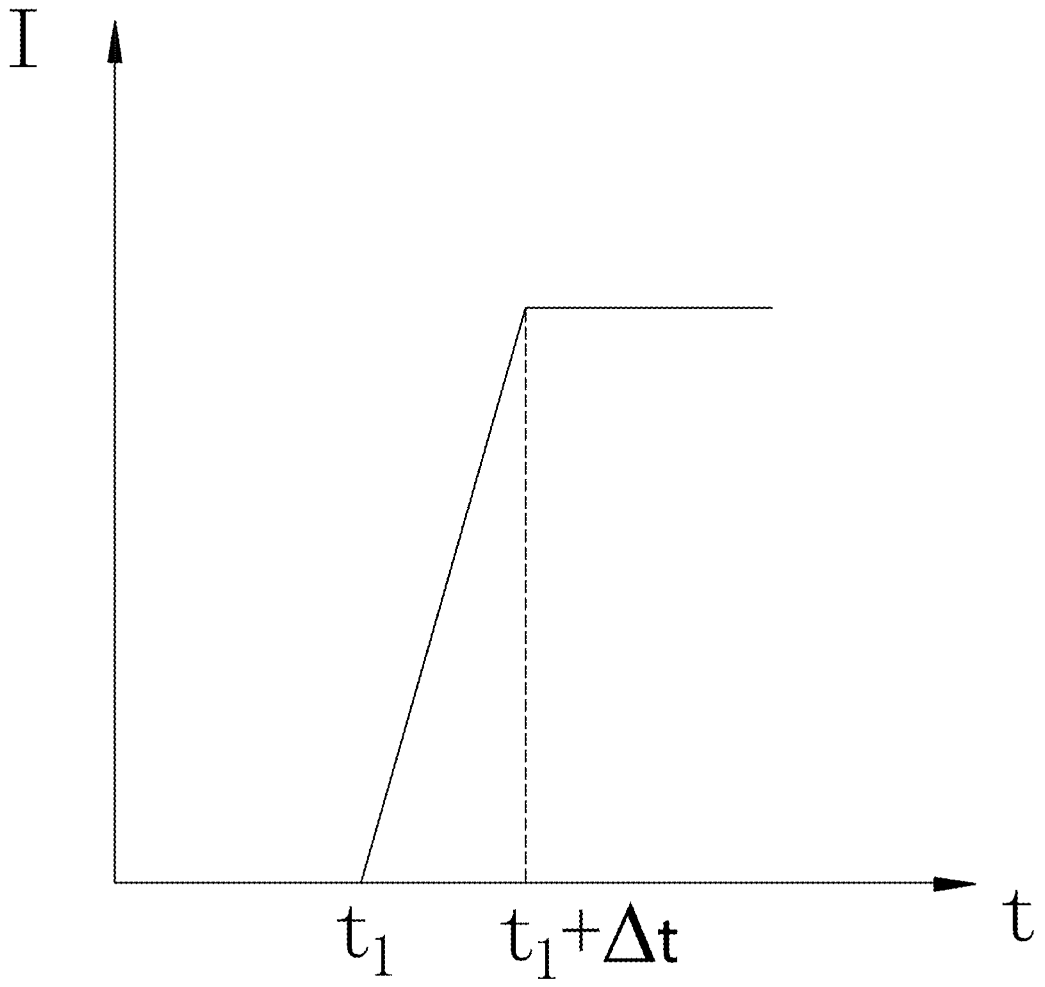
FIG. 7 is an oscillogram of a total load current I shown in FIG. 4.

To further describe the principle of the electronic load testing system 10 provided in the present invention, referring to FIG. 2, FIG. 5, and FIG. 7 which are respectively oscillograms of the first input signal $I_a$, the first current $I_1$, the second input signal $I_b$, the second current $I_2$, and the total load current I, the first input signal $I_a$ is provided by the control module 7; to test the high dynamic performance of the switching power supply 30, it is assumed that the provided first input signal $I_a$ is inputted to the first electronic load 3 from time $t_1$ and rises rapidly, with the rising speed set to be 100 A per microsecond, reaches the highest value in $\Delta t$ microseconds, and is then kept unchanged. In an ideal condition, the change of the first current $I_1$ outputted by the first electronic load 3 shall be kept consistent with the change of the first input signal $I_a$. However, due to the influence of the distributed inductance in the testing cable 1, the rising speed of the first current $I_1$ is significantly lower than that of the first input signal $I_a$, resulting in that the first current $I_1$ reaches the highest value at time $t_2$, where the rising time is $t_2-t_1>\Delta t$.

To compensate the difference therebetween, the control module 7 provides the second electronic load 5 with the second input signal $I_b$. Since the second current $I_2$ outputted by the second electronic load 5 is not affected by the distributed inductance of the testing cable 1, the change of the second current $I_2$ is kept consistent with the change of the second input signal $I_b$. After the control module 7 provides the first input signal $I_a$ and the second input signal $I_b$ set in a correlated manner, the total load current I of the switching power supply 30 is equal to the sum of the first current $I_1$ and the second current $I_2$. When the change of the total load current I is kept consistent with the change of the first input signal $I_a$, the purpose of detecting the high dynamic performance of the switching power supply 30 is realized.

Figure 8:
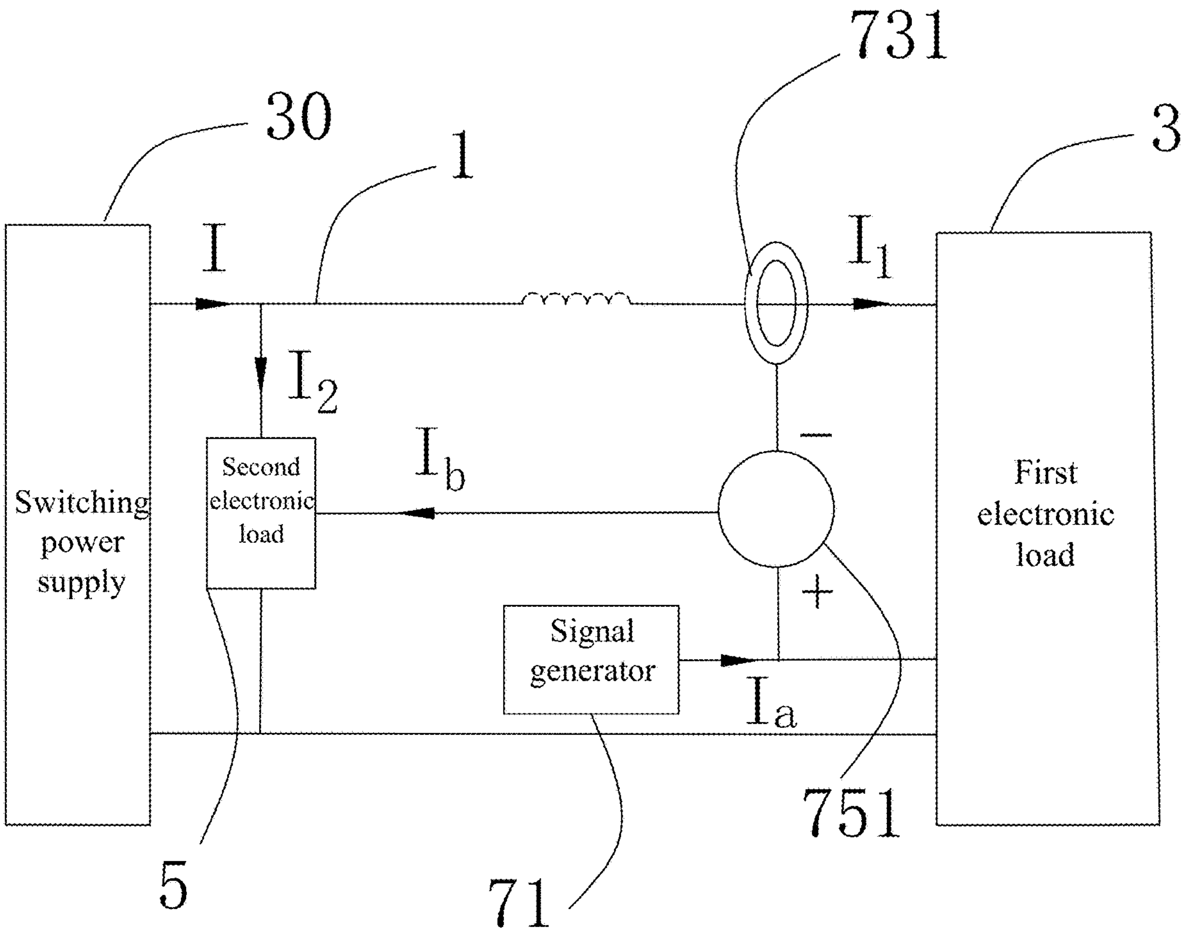
FIG. 8 is a topological graph of a second embodiment of the electronic load testing system provided by the present disclosure.

Continuously referring to FIG. 8, FIG. 8 is a topological graph of a second embodiment of the electronic load testing system provided by the present invention. For more precise and convenient control, the control module 7 includes a signal generator 71, a signal detector 73, and a signal processor 75, where the signal generator 71 is connected to the first electronic load 3 and provides the first input signal $I_a$, and the first electronic load 3 outputs the first current $I_1$. The signal detector 73 is provided at one end of the first electronic load 3 and detects the first current $I_1$ outputted by the first electronic load 3. The signal processor 75 is respectively connected to the signal generator 71, the signal detector 73 and the second electronic load 5 and inputs a difference between the first input signal $I_a$ and the first current $I_1$ to the second electronic load 5, the second electronic load 5 outputs the second current $I_2$, and the change of the total load current I is kept consistent with the change of the first input signal $I_a$.

It shall be noted herein that the control module 7 cannot only provide the first electronic load 3 and the second electronic load 5 with signals, but also independently provide the first electronic load 3 or the second electronic load 5 with signals. For example, in this embodiment, the control module 7 provides the first electronic load 3 with the first input signal $I_a$ independently by providing the signal generator 71 and then generates the second input signal $I_b$ through the signal detector 73 and the signal processor 75. The second input signal $I_b$ is equal to the difference between the first input signal $I_a$ and the first current $I_1$, so that the first input signal $I_a$ and the second input signal $I_b$ are set in a correlated manner.

The control module 7 respectively provides the first input signal $I_a$ and the second input signal $I_b$. The first input signal $I_a$ and the second input signal $I_b$ may not be correlated with each other because a certain link or circuit in the electronic load testing system 10 has a calculation deviation, which affects testing of the switching power supply 30. The signal detector 73 may directly measure the first current $I_1$. The signal processor 75 directly calculates the difference between the first input signal $I_a$ and the first current $I_1$, which may specify the influence of the testing cable 1 on the first electronic load 3, so as to provide the second electronic load 5 with the completely matched and complementary second input signal $I_b$. This setting mode only needs to provide one signal generator 71 to simultaneously and synchronously provide the first input signal $I_a$ and the second input signal $I_b$ by the control module 7, so that the cost is reduced while control is easy. Moreover, the second input signal $I_b$ will change correspondingly with the change of the first current $I_1$, so that the detection result is more precise and effective.

Further, the signal detector 73 and the signal processor 75 are provided, so that the total load current I is kept equal to the first input signal $I_a$. To test the high dynamic performance of the switching power supply 30, the electronic load testing system 10 needs to ensure that the change of the total load current I is kept consistent with the change of the first input signal $I_a$.

The so called keeping consistent means that when the change of the first input signal $I_a$ is controlled, the total load current I can change at the same time and the rate of change is the same as that of the first input signal $I_a$ or is in a linear relation with the rate of change of the first input signal. For example herein, the first input signal $I_a$ starts to rise from 0A at the time $t_1$, reaches 100 A in 1 microsecond, and no longer changes; synchronously, the total load current I starts to rise from 0 A at the time $t_1$, reaches the highest rising point in 1 microsecond, and no longer changes; and the current at the highest rising point of the total load current I shall be K*100 A, where K is a correlation coefficient.

Since the change of the total load current I is kept consistent with the change of the first input signal $I_a$, a tester may provide a change curve of the total load current I through which related parameters may be known by controlling a change curve of the first input signal $I_a$ when using the electronic load testing system 10, so as to test the switching power supply 30. In this embodiment, a solution where the total load current I is kept equal to the first input signal $I_a$ is preferred. This setting may determine the change curve of the total load current I more effectively and intuitively, and the control module 7 may be designed more simply and conveniently, so that the production cost of the electronic load testing system 10 is saved.

To stably keep the total load current I consistent with the first input signal $I_a$, the signal detector 73 is configured as a current sensor 731, the signal processor 75 is configured as a subtracter 751, the signal generator 71 is connected to a non-inverting input terminal of the subtracter 751, the current sensor 731 is connected to an inverting input terminal of the subtracter 751, and an output terminal of the subtracter 751 is electrically connected to the second electronic load 5. The control module 7 may detect the first current $I_1$ outputted by the first electronic load 3 in real time by providing the current sensor 731 at one end of the first electronic load 3 and input the first current $I_1$ to the inverting input terminal of the subtracter 751. This setting mode may ensure that the second input signal $I_b$ outputted by the second electronic load 5 is completely equal to the difference between the first input signal $I_a$ and the first current $I_1$, and the total load current I, the second current $I_2$, and the first current $I_1$ will stably change with the change of the first input signal $I_a$ in real time. Moreover, this setting mode is simpler in overall structure, and the size and weight of the control module 7 may be effectively controlled.

Figure 9:
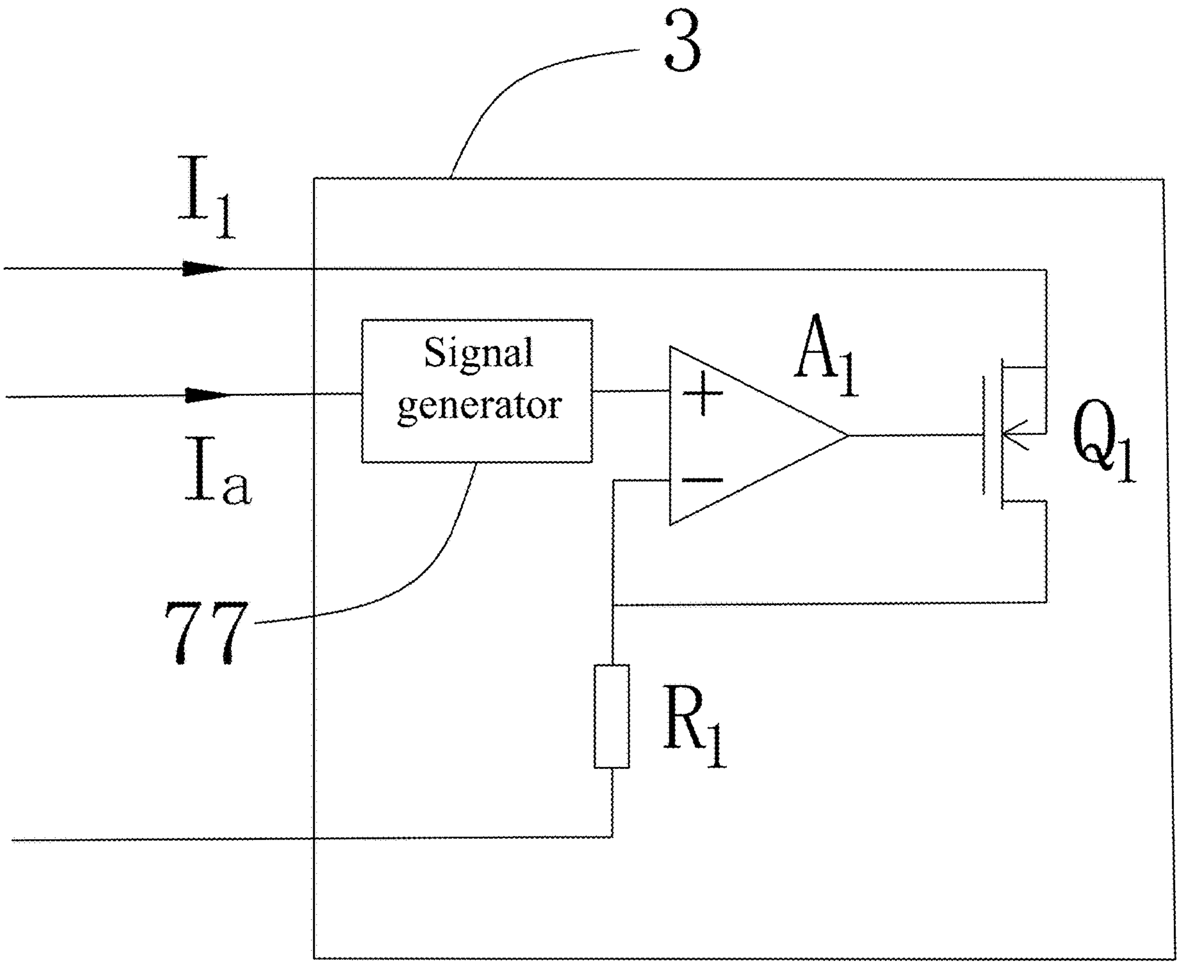
FIG. 9 is a circuit diagram of the first electronic load shown in FIG. 8.
Figure 10:
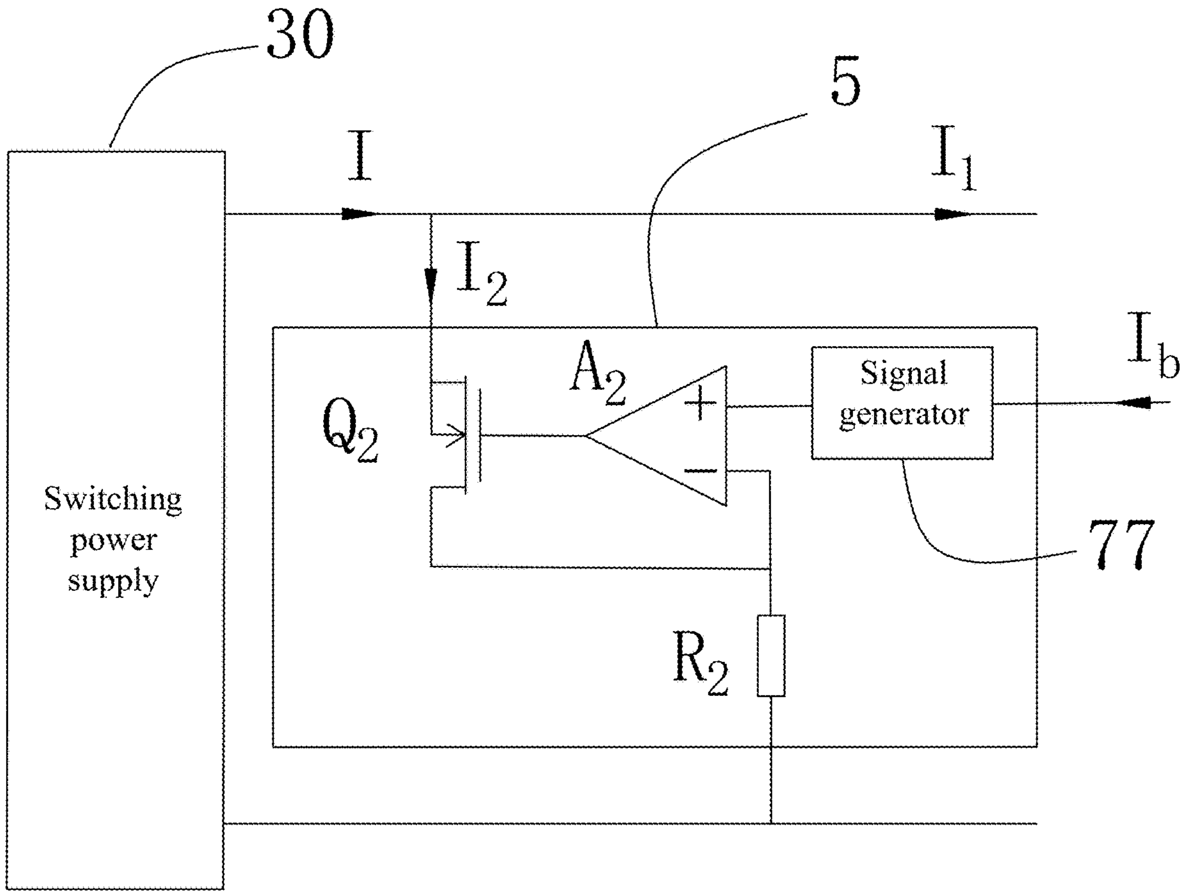
FIG. 10 is a circuit diagram of the second electronic load shown in FIG. 8.

Continuously referring to FIG. 9 and FIG. 10, FIG. 9 and FIG. 10 are respectively circuit diagrams of the second electronic load 3 and the second electronic load 5. The first electronic load 3 includes a first operational amplifier $A_1$, a first sampling resistor $R_1$, and a first MOS transistor $Q_1$. The first input signal $I_a$ is inputted to a non-inverting input terminal of the first operational amplifier $A_1$, the first sampling resistor $R_1$ is provided between the distal end of the testing cable 1 and an inverting input terminal of the first operational amplifier $A_1$, a gate of the first MOS transistor $Q_1$ is connected to an output terminal of the first operational amplifier $A_1$, a drain of the first MOS transistor $Q_1$ is connected to the distal end of the testing cable 1, and a source of the first MOS transistor $Q_1$ is connected to the first sampling resistor $R_1$ and the inverting input terminal of the first operational amplifier $A_1$. The first electronic load 3 realizes signal conversion by providing the first operational amplifier $A_1$, the first sampling resistor $R_1$, and the first MOS transistor $Q_1$. After the first input signal $I_a$ is inputted, drain current flowing through the first MOS transistor $Q_1$ is controlled by controlling a gate voltage of the first MOS transistor $Q_1$ to steplessly adjust the first current $I_1$ and consume electric energy depending on dissipated power of the first MOS transistor $Q_1$. The first operational amplifier $A_1$ works in a negative feedback status, with the voltage at the non-inverting terminal equal to that at the inverting terminal. Therefore, the change of the first current $I_1$ may be adjusted by adjusting the change of the first input signal $I_a$.

Correspondingly, the second electronic load 5 includes a second operational amplifier $A_2$, a second sampling resistor $R_2$, and a second MOS transistor $Q_2$. The second input signal $I_b$ is inputted to a non-inverting input terminal of the second operational amplifier $A_2$, the second sampling resistor $R_2$ is provided between the proximal end of the testing cable 1 and an inverting input terminal of the second operational amplifier $A_2$, a gate of the second MOS transistor $Q_2$ is connected to an output terminal of the second operational amplifier $A_2$, a drain of the second MOS transistor $Q_2$ is connected to the proximal end of the testing cable 1, and a source of the second MOS transistor $Q_2$ is connected to the second sampling resistor $R_2$ and the inverting input terminal of the second operational amplifier $A_2$. The circuit structure of the second electronic load 5 is integrally similar to the circuit structure of the first electronic load 3 and the difference lies in that the power of the second MOS transistor $Q_2$ is relatively low without the need to provide large radiators and fans. Therefore, the second electronic load 5 is smaller in overall size, so that it is ensured that the second sampling resistor $R_2$ and the drain of the second MOS transistor $Q_2$ can be connected to the proximal end of the testing cable 1 or may be directly provided on the switching power supply 30.

By means of the above setting mode, the overall circuit structures of the first electronic load 3 and the second electronic load 5 are simple and not prone to errors, so that following changes of the first current $I_1$ and the second current $I_2$ can be effectively realized. To ensure that the first electronic load 3 and the second electronic lode 5 can match the control module 7, the total load current I is kept consistent with the first input signal $I_a$. The non-inverting input terminals of the first operational amplifier $A_1$ and/or the second operational amplifier $A_2$ are provided with signal converters 77, and the first input signal $I_a$ and/or the second input signal $I_b$ are inputted to the non-inverting input terminals of the first operational amplifier $A_1$ and/or the second operational amplifier $A_2$ through the signal converters 77. In the embodiment, the first electronic load 3 and the second electronic load 5 both are provided with the signal converters 77. By providing the signal converters 77, the outputs of the first electronic load 3 and the second electronic load 5 may be more precisely controlled, i.e., the changes of the first current $I_1$ and the second current $I_2$ may fall within a precisely controlled range, so that the total load current I is precisely controlled. In addition, by providing the signal converters 77, the select range of test signals may be widened. Regardless of digital signals or analog signals, the first input signal $I_a$ provided by the signal generator 71 will not be limited by a specific signal type, so that it is more convenient to test.

In this embodiment, load power of the first electronic load 3 is 80-120 times that of the second electronic load 5. For example, if the load power of the first electronic load 3 is set as 1 KW, the load power of the second electronic load 5 is set as 8 W or 12 W. Due to the 80-120-time difference between the power of the second electronic load 5 and the first electronic load 3, the size and weight of the second electronic load 5 may be effectively limited, so that installation is easier; and moreover, a rapidly changing pulse current which cannot be realized by the first electronic load 3 may be effectively supplemented.

The above is merely exemplary implementations of the present invention. It shall be noted that those of ordinary skill in the art may make improvements without departing from the concept of the present invention and the improvements shall fall within the protection scope of the present invention.

What is claimed is:

1. An electronic load testing system, providing a measured high-power switching power supply with a load current with high dynamic performance, and comprising:

a testing cable, wherein a proximal end of the testing cable is connected to the switching power supply;

a first electronic load, wherein the first electronic load is provided at a distal end of the testing cable and the testing cable is provided between the first electronic load and the switching power supply;

a second electronic load, wherein the second electronic load is provided at the proximal end of the testing cable, is close to the switching power supply or is directly provided at an output terminal of the switching power supply; and a control module, wherein the control module is respectively connected to the first electronic load and the second electronic load and inputs a first input signal and a second input signal set in a correlated manner, and the first electronic load and the second electronic load respectively output a first current and a second current to the switching power supply, so that a change of a total load current is kept consistent with a change of the first input signal;

wherein, a rate of change of the second current is higher than a rate of change of the first current.

2. The electronic load testing system according to claim 1, wherein the control module comprises:

a signal generator, wherein the signal generator is connected to the first electronic load and provides the first input signal, and the first electronic load outputs the first current;

a signal detector, wherein the signal detector is provided at one end of the first electronic load and detects the first current outputted by the first electronic load; and a signal processor, wherein the signal processor is respectively connected to the signal generator, the signal detector and the second electronic load and input a difference between the first input signal and the first current to the second electronic load, and the second electronic load outputs the second current.

3. The electronic load testing system according to claim 2, wherein the total load current is kept equal to the first input signal.

4. The electronic load testing system according to claim 3, wherein the signal detector is configured as a current sensor, the signal processor is configured as a subtracter, the signal generator is connected to a non-inverting input terminal of the subtracter, the current sensor is connected to an inverting input terminal of the subtracter, and an output terminal of the subtracter is electrically connected to the second electronic load.

5. The electronic load testing system according to claim 1, wherein the first electronic load comprises:

a first operational amplifier, wherein the first input signal is inputted to an non-inverting input terminal of the first operational amplifier;

a first sampling resistor, wherein the first sampling resistor is provided between the distal end of the testing cable and an inverting input terminal of the first operational amplifier; and a first MOS transistor, wherein a gate of the first MOS transistor is connected to an output terminal of the first operational amplifier, a drain of the first MOS transistor is connected to the distal end of the testing cable, and a source of the first MOS transistor is connected to the first sampling resistor and the inverting input terminal of the first operational amplifier.

6. The electronic load testing system according to claim 1, wherein the second electronic load comprises:

a second operational amplifier, wherein the second input signal is inputted to the non-inverting input terminal of the second operational amplifier;

a second sampling resistor, wherein the second sampling resistor is provided between the proximal end of the testing cable and the inverting input terminal of the second operational amplifier; and a second MOS transistor, wherein a gate of the second MOS transistor is connected to an output terminal of the second operational amplifier, a drain of the second MOS transistor is connected to the proximal end of the testing cable, and a source of the second MOS transistor is connected to the second sampling resistor and the inverting input terminal of the second operational amplifier.

7. The electronic load testing system according to claim 5, wherein the non-inverting input terminal of the first operational amplifier is provided with a signal converter, and the first input signal is inputted to the non-inverting input terminal of the first operational amplifier through the signal converter.

8. The electronic load testing system according to claim 6, wherein the non-inverting input terminal of the second operational amplifier is provided with a signal converter, and the second input signal is inputted to the non-inverting input terminal of the second operational amplifier through the signal converter.

9. The electronic load testing system according to claim 1, wherein load power of the first electronic load is 80-120 times that of the second electronic load.

* * * * *